United States Patent [19]

Lewis et al.

[11] Patent Number: 5,106,695
[45] Date of Patent: Apr. 21, 1992

[54] METHOD AND MEANS FOR PRODUCING COLOR PROOFS

[75] Inventors: Thomas E. Lewis, E. Hampstead, N.H.; Michael T. Nowak, Gardner, Mass.

[73] Assignee: Presstek, Inc., Hudson, N.H.

[21] Appl. No.: 537,419

[22] Filed: Jun. 13, 1990

[51] Int. Cl.⁵ .................................. B32B 9/00
[52] U.S. Cl. .................................. 428/457; 428/195; 428/204; 428/206; 428/411.1; 428/537.5; 346/1.1; 156/625; 156/627
[58] Field of Search ............... 346/161; 428/195, 204, 428/206, 457, 411.1, 537.5; 156/625, 627

[56] References Cited

U.S. PATENT DOCUMENTS

| | | | |
|---|---|---|---|
| 3,682,633 | 5/1970 | Curtin | 96/27 |
| 3,744,611 | 7/1973 | Montanari et al. | 197/1 R |
| 4,304,836 | 12/1981 | Cheema et al. | 430/252 |
| 4,438,170 | 3/1984 | McCue | 346/162 |
| 4,568,621 | 2/1986 | Aviram et al. | 430/5 |
| 4,626,256 | 12/1986 | Kawasaki et al. | 8/471 |
| 4,686,163 | 8/1987 | Ng et al. | 430/47 |
| 4,708,459 | 11/1987 | Cowan et al. | 355/4 |
| 4,748,102 | 5/1988 | Weller, Jr. et al. | 430/258 |
| 4,780,744 | 10/1988 | Porter et al. | 430/143 |
| 4,808,508 | 2/1989 | Platzer | 430/252 |
| 4,820,687 | 4/1989 | Kawasaki et al. | 503/227 |
| 4,822,674 | 4/1989 | Malhotra et al. | 428/336 |
| 4,833,124 | 5/1989 | Lum | 503/227 |
| 4,842,950 | 6/1989 | Barton | 428/483 |

FOREIGN PATENT DOCUMENTS

| | | |
|---|---|---|
| 3322027 | 12/1984 | Fed. Rep. of Germany . |
| 61-286198 | 6/1985 | Japan . |
| 63-309494 | 6/1987 | Japan . |
| 63-309495 | 6/1987 | Japan . |
| 649953 | 2/1979 | U.S.S.R. . |
| 1088117 | 10/1967 | United Kingdom . |

OTHER PUBLICATIONS

Jap. Journ. Appl. Phys., vol. 18, No. 6, Jun. 1979, pp. 1165-1169.

Primary Examiner—Patrick J. Ryan
Attorney, Agent, or Firm—Cesari and McKenna

[57] ABSTRACT

A novel color proofing construction and method of producing color proofs using spark-discharge recording apparatus. The recording constructions of the present invention comprise a conductive layer, an ink-transfer or toner-accepting layer, a support layer and, optionally, a coating layer and/or an undercoating layer.

42 Claims, 1 Drawing Sheet

METHOD AND MEANS FOR PRODUCING COLOR PROOFS

BACKGROUND OF THE INVENTION

A. Field of the Invention

The present invention relates to production of color dye-transfer separations, or "proofing bases", and more particularly to a method for producing proofing bases using spark-discharge recording techniques and constructions therefor.

B. Description of the Related Art

Graphic-arts practitioners use color proofing sheets (or simply "color proofs") to correct separation images prior to producing final separation plates, as well as to evaluate the color quality that will be obtained during the printing process. In typical printing processes, multicolor images cannot be printed directly using a single printing plate. Rather, composite color images are first decomposed into a set of constituent color components, or "separations", each of which serve as the basis for an individual plate. The colors into which the multicolor image is decomposed depends on the particular "color model" chosen by the practitioner. The most common color model is based on cyan, magenta, yellow and black constituents, and is referred to as the "CMYK" color model. If the separation is performed properly, subtractive combination of the individual separations produces the original composite image. A color proof represents, and permits the practitioner to view, the final image as it will appear when printed.

The most common method of producing a color proof involves preparing translucent representations of each separation on transparent supports. A coloring agent corresponding to each separation color is applied to an individual transparent substrate according to the distribution of that color in the final image. The complete set of color proofs corresponding to a multicolor image may be superposed on each other in registration, thereby revealing the final image, or individually analyzed with respect to the corresponding separation printing plate.

The translucent images are often prepared using photopolymerization and thermal transfer techniques. First, black-and-white separations corresponding to each color of the color model are produced using conventional color-analysis methods. These separations are interposed between individual "proofing bases", which consist of a support coated with photopolymerizable material, and a suitable source of radiation. The radiation polymerizes the coating, rendering it unsuitable for transfer. The surface of each exposed proofing base is then pressed into contact with a sheet of the final transparency material, and one or both elements heated to a temperature above the transfer temperature of the unexposed (and hence unpolymerized) portions of the proofing base. This causes the unexposed transfer material to be laminated onto the transparency sheet. The proofing bases and transparency sheets are then separated. If the transfer material is not colored, the imaged transparent substrates can be subjected to the action of various colorant toners, which adhere only to the transfer material and not the transparency sheet. The exposure, transfer and toning steps must be carried out for each translucent image. Although widely employed, this process is time-consuming and not amenable to digital control.

U.S. Pat. No. 3,780,214 describes a thermal-transfer process for producing color prints in which a laser is employed either (1) to heat portions of a thermosensitive recording layer so as to facilitate transfer of these portions to a suitable substrate, or (2) to destroy portions of a recording layer so that such portions are unavailable for transfer. Laser equipment tends to be costly and, for the thermal processes envisioned in this reference, potentially slow-acting. In addition, the thermoplastic characteristics of the recording layer must be compatible with the particular laser, which limits the choice of recording materials.

The present invention utilizes contacting or non-contacting spark-discharge recording apparatus to create color-transfer proofing bases. In contacting spark-discharge apparatus, an electric current is applied from a needle electrode to the electroconductive layer of a suitable recording medium, causing a spark discharge therebetween. The effect of the spark can be to destroy the electroconductive layer or alter its surface characteristics. See, e.g., U.S. Pat. No. 4,596,733 and references discussed therein. The non-contacting apparatus causes a similar spark discharge to take place between a recording stylus and an electroconductive layer, but physical contact between these components is unnecessary. This latter approach allows greater flexibility in the choice of recording media, and also avoids unwanted scratch marks which sometimes result from electrode contact. Non-contacting spark-discharge recording apparatus are described in copending application Ser. No. 07/234,475 (commonly owned with the present application). Both contacting and non-contact apparatus are amenable to computer control.

DESCRIPTION OF THE INVENTION

A. Objects of the Invention

Accordingly, it is an object of the present invention to facilitate production of color proofs using spark-discharge recording techniques.

It is a further object of the invention to provide proofing base material for use with spark-discharge recording apparatus.

It is another object of the invention to provide an affordable method of producing color proofs that can be used with a variety of color-transfer materials.

It is yet another object of the invention to facilitate production of color proofs having fine features and line definition.

Other objects will, in part, be obvious and will, in part, appear hereinafter. The invention accordingly comprises the several steps and the relation of one or more of such steps with respect to the others, all as exemplified in the following summary and detailed description, and the scope of the invention will be indicated in the claims.

B. Summary of the Invention

The method of the present invention comprises use of a contacting or noncontacting spark-discharge recording apparatus (such as those described in U.S. Pat. No. 4,596,733 and copending application Ser. No. 07/234,475, respectively, the contents of each of which are hereby incorporated by reference) to destroy, at selected points, the top "mask" or negative layer of a proofing base construction, thereby either allowing penetration and transfer of underlying colored material at these points, or exposing a layer of weak adhesive capable of accepting toner particles for subsequent transfer. The image revealed on the proofing base by the spark discharge corresponds to the distribution of the corresponding color in the final image.

A proofing base is prepared for each color of the chosen color model by digitally representing the color separations, and using this digital representation to control movement and firing of the spark-discharge recording head with respect to the proofing base constructions; alternatively, the proofing base constructions can be immobilized on a movable support, which is advanced across the discharge path of the recording head.

The colored transfer material can be a meltable, thermal-transfer ink or sublimation-type ink, which is rendered transferably by the application of heat. As used herein, the term "thermal-transfer ink" refers to an admixture composed of one or more pigments or one or more dyes ("coloring agents") dispersed or dissolved in a binder substance that softens or partially melts at elevated temperatures, so as to become tacky; this property allows transfer of the coloring agent to an image-receiving substrate, generally under the influence of applied pressure, when heated in contact therewith. The term "sublimation ink" refers to an admixture containing a dye that sublimes at an elevated temperature, thereby becoming susceptible to transfer from the ink composition to the image-receiving substrate.

Alternatively, a layer of weak adhesive can underlie the masking layer, such that selective removal of the latter reveals a surface capable of accepting toner particles or liquid for subsequent transfer to a receiver material that binds more strongly than the weak adhesive layer. As used herein, "toner" refers to a dispersion of solid particles or liquid medium that exhibits varying degrees of adhesion to different surfaces. The basis of adhesion may be chemical, physical or electrostatic.

Brief Description of the Drawings

The foregoing discussion will be understood more readily from the following detailed description of the invention, when taken in conjunction with the accompanying drawings, in which.

Detailed Description of the Invention

Figure 1A:
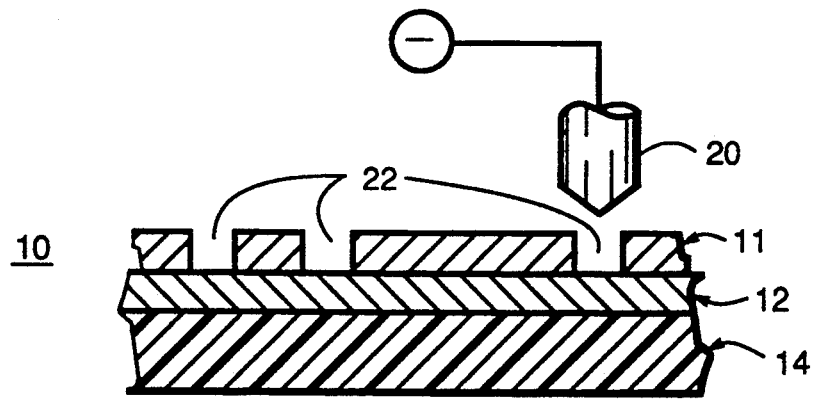
FIG. 1A depicts a cross-sectional view generally representative of the constructions of the present invention.

Refer first to FIG. 1A, in which reference numeral 10 denotes generally a cross-sectional view of a composite structure suitable for use as a proofing base in accordance with the method of the present invention. A substrate 14 provides support for a transfer layer 12 and a conductive layer 11. Portions of conductive layer 11 are burned away or vaporized by spark discharges from an imaging head 20, resulting in a series of gaps 22. Imaging head 20 may make contact with conductive layer 11 or remain at a discrete distance therefrom.

Figure 1B:
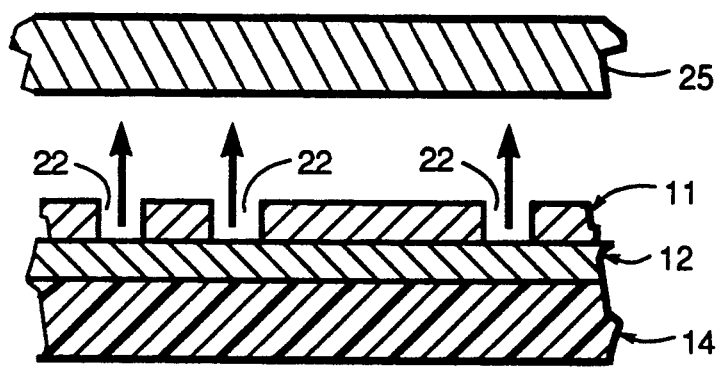
FIG. 1B illustrates the ink-transfer embodiment of the present invention and its mechanism of operation.

Turn now to FIG. 1B, which illustrates the ink-transfer embodiment of the present invention. As illustrated in the figure, the imaged proofing base is brought into contact with an image-receiving substrate 25 under conditions that cause transfer of the material of transfer layer 12 through gaps 22 and onto image-receiving substrate 25. Thus, the pattern of gaps 22 that was created by electroerosion of conductive layer 11 is substantially reproduced on image-receiving substrate 25 in the color of the material constituting transfer layer 12.

Figure 2:
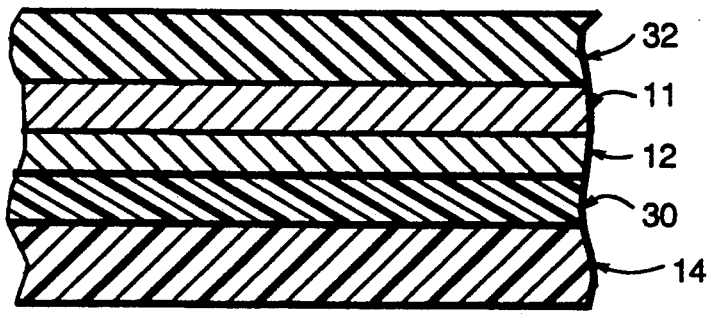
FIG. 2 is a cross-sectional view of an alternative embodiment, which contains coating and undercoating layers.

FIG. 2 illustrates another of our proofing base structures. To the structure depicted in FIGS. 1A and 1B has been added an undercoating layer 30 and coating layer 32.

The illustration of FIG. 1A is also representative of the toner-transfer embodiment of the present invention. In this case, however, layer 12 is an adhesive or tacky layer that bonds weakly to toner, while masking layer 11 does not bond with (or repels) the toner. After imaging head 20 completes selective removal of masking layer 11, toner is applied to the entire surface. The proofing base is then perturbed, e.g. mechanically or electrostatically, to remove toner from masking layer 11. Finally, the proofing base is brought into contact with a receiver substrate that exhibits greater affinity for toner than adhesive layer 12.

The various layers of our composite structure will now be discussed in detail.

1) Substrate 14

The function of substrate 14 is support. Hence, although a suitable material should be flexible and durable in order to accommodate a variety of imaging configurations and to withstand the heat and pressure conditions necessary to cause transfer, the choice of material is not critical. We have obtained good results using paper, as well as plastic film such as optical grade polyester film.

Paper is well-suited to thermal-transfer inks. We have found that if the pH of the paper has been controlled during fabrication, the paper can withstand significant heat without degrading. Alternatively, virtually any plastic film that offers some degree of adhesion may be used in lieu of polyester material, including polystyrene, cellulose acetate, and the coated paper compositions discussed below. Preferably, substrate layer 14 is at least 0.002 inch thick.

2) Conductive Layer 11

Conductive layer 11 provides the negative or "mask" layer which controls penetration or exposure of the underlying transfer layer. This layer is a conductive, preferably metal material that is susceptible to removal by the action of a high-voltage spark produced by imaging head 20. This layer should also be relatively thin, on the order of 350 to 700 angstroms, in order to facilitate rapid imaging. Layers of this thickness can be applied by vapor deposition or vacuum metallization. We have obtained good results using aluminum, copper and zinc.

One critical feature that should be possessed by the material of conductive layer 11 is non-adhesion to materials used as image-receiving substrates. In particular, physical changes in the image-receiving material caused by thermal contact can result in the acquisition by this material of enhanced adhesive properties; accordingly, careful selection of conductive-layer material is necessary to ensure that adhesion to the image-receiving substrate does not develop over the range of operating conditions. The metal and selective filler materials described above have been found to meet these criteria.

3) Transfer Layer 12: Ink-Transfer Embodiment

The ink of ink-transfer layer 12 should be chosen so as to be compatible with the material of image-receiving substrate 25; indeed, the two are best viewed as a single complementary system. As noted hereinabove, thermal-transfer inks usually contain one or more dyes or one or more pigments. The binder is chosen to become tacky at or above a particular "transfer temperature", promoting displacement by allowing the ink (primarily the binder) to develop equal or stronger adhesion to the image-receiving substrate as compared with the layer upon which it was originally deposited. Thus, not all thermal-transfer inks will be compatible with all substrates, although as a class, thermal-transfer inks exhibit the least individual selectivity with respect to substrate. Furthermore, the range of image-receiving substrates that are compatible with a particular thermal-transfer ink can be extended by adding an undercoating layer, as described below.

In general, the color of a sublimation ink is transferred to image-receiving substrate 25 from the ink composition by vaporization of the dye component and subsequent passage through the imaged gaps. However, the solubility of the dye in image-receiving substrate 25 should be equal to or greater than its solubility in the ink formulation, or transfer equilibrium will occur with too little of the dye having passed into the image receiver. Ideally, dye molecules enter the resinous material and disperse as a solid solution therein, typically due to a compatible molecular charge structure.

Unlike thermal-transfer binding substances, the binder in which the sublimation dye is dispersed should easily release dye molecules upon application of heat. These binders should be able to tolerate heat without losing adhesion to substrate 14 (or undercoating 30), which would result in competition with the dye molecules for entry into the matrix of image receiver 25. Furthermore, the dye cannot be soluble in the layer immediately beneath ink-transfer layer 12; use of an undercoating layer may be necessary to prevent loss of dye into substrate 14, as discussed below.

It is important to stress that the operative consideration regarding choice of a sublimation ink is its solubility behavior rather than mechanism of action. Many substances commonly referred to as "sublimation" inks do not, in fact, produce color by solid-to-gas transition. For example, some "sublimation" dyes are soluble as liquids or critical fluids in receiver materials that have been heated above their glass transition temperatures, resulting in migration of dye molecules into the softened receiver material due to thermodynamic favorability of the solvated state. Other "sublimation" dyes simply exhibit high vapor pressures at temperatures below their boiling points, rendering a sufficient number of dye molecules available for solvation within the receiver material. Accordingly, as used herein, the term "sublimation" refers not only to passage directly from the solid into the gaseous phase, but more generally to physical and solubility characteristics of dye substances that permit their introduction into receiver material at reasonable working temperatures.

Examples of suitable sublimation dyes may be found in U.S. Pat. No. 4,833,124 (the entire disclosure of which is hereby incorporated by reference).

4) Transfer Layer 12: Toner-Transfer Embodiment

The material of toner-transfer layer 12 should be compatible with both the toner and image-receiving substrate 25. The toner should adhere less strongly to mask layer 11 than to layer 12, and less strongly to layer 12 than to image-receiving substrate 25. It should be emphasized that conditions promoting adhesion to substrate 25 can be introduced at the time of transfer; for example, substrate 25 can be exposed directly to conditions such as heat or an electrostatic charging field just prior to transfer.

Toner-transfer systems that optimize characteristics of the transfer material, receiver material and toner are well-known in the art.

5) Undercoating Layer 30

Undercoating layer 30 may be employed to control loss of a sublimation dye into substrate 14, to secure the binder of a sublimation dye to the composite structure, or to render a particular thermal-transfer ink compatible with an image receiver of interest. With respect to the first function, any material in which the dye is insoluble and through which it cannot diffuse is suitable. Good results can be achieved with paper, suitable films (such as polyester), or paper to which a suitable film (such as MYLAR, sold by E.I. duPont de Nemours Company) has been laminated; this prevents loss of dye into the paper fibers, while permitting use of paper as the layer in closet contact with the source of heat. Other suitable undercoating materials are set forth in U.S. Pat. No. 4,833,124.

As to ink compatibility, it will be recalled that thermal-transfer inks pass from a substrate to an image receiver due to favorable adhesion characteristics of the latter as compared with the former. In order to obtain a suitable adhesion differential, it may be necessary to coat substrate 14 with a material that exhibits poorer adhesion properties. Various types of coatable, thermally resistant silicone compositions that will perform this function are currently available.

It is also necessary to retain contact between the binder in which a sublimation dye is dispersed and the composite structure during the transfer process. Failure to retain contact can result in slippage and consequent smear of the applied dye. Accordingly, it is sometimes desirable to add a layer above substrate 14 with a material that exhibits better adhesion properties with respect to the composite structure.

6) Coating Layer 32

Coating layer 32 is necessary where conductive layer 11 must be reinforced to survive process conditions such as the contact pressure necessary to facilitate thermal-transfer printing. This layer may also be desirable to provide an additional barrier to sublimation dyes if imperfections in conductive layer 11 are encountered.

The selective filler materials described in copending application Ser. No. 07/442,317 may also be dispersed within coating layer 32 to enhance accuracy of image formation with a non-contact spark-discharge recording device.

The choice of chemistry to be used will depend more strongly on characteristics of the coating equipment and environmental concerns than performance properties of the materials themselves; a crosslinking reaction is also not an absolute requirement. Another important criterion for coating layer 32 is that it neither possess nor develop at elevated temperature an adhesion to image receiver 25. Coatings that cure at elevated temperatures have been found to satisfy this requirement, since heating does not destroy the internal bonding structure. Suitable classes of coating include:

Thermoset: Typical thermoset reactions involve an aminoplast resin with hydroxyl sites of the primary coating resin. These reactions are greatly accelerated by creation of an acid environment and the use of heat.

Isocyanate Based: One typical approach involves two-part urethanes, in which a polyisocynate component reacts with hydroxyl sites on one or more "backbone" resins (often referred to as the "polyol" component). Typical polyols include polyethers, polyesters, and acrylics having two or more hydroxyl functional sites. Important modifying resins include hydroxyl-functional vinyl resins and cellulose ester resins. The isocyanate component will contain two or more isocyanate groups and may be monomeric or oligomeric. The reactions proceed at ambient temperatures, but can be accelerated using heat and selected catalysts (such as tin compounds and tertiary amines). The isocyanate functional component(s) and the polyol component(s) are normally mixed just prior to use. Although the reactions begin immediately, the rates are slow enough at ambient temperatures to allow a "potlife" during which the coating can be applied.

In another approach, the isocyanate is used in a "blocked" form in which the isocyanate component has been reacted with another component such as a phenol or a ketoxime to produce an inactive, metastable compound. This compound is designed to decompose at elevated temperatures, thereby liberating the active isocyanate component which then reacts to cure the coating. The reaction may be accelerated by incorporation of appropriate catalysts in the coating formulation.

Aziridines: These compounds promote the crosslinking of waterborne coatings based on carboxyl-functional resins. The carboxyl groups are incorporated into the resins to provide sites that form salts with water soluble amines, a reaction integral to the solubilizing or dispersing of the resin in water. The reaction proceeds at ambient temperatures after the water and solubilizing amine(s) have been evaporated after deposition of the coating. The aziridines are added to the coating at the time of use and have a potlife governed by their rate of hydrolysis in water to produce inert by-products.

Epoxy Reactions: Epoxy resins are often cured by cationic polymerization, using Lewis acid catalysts such as boron trifluoride and its complexes, which form polyethers from the epoxide groups. Another reaction is based on cationic catalysts generated for the reaction by exposure to ultraviolet radiation. Union Carbide's Cyracure system is a commercially available version.

Radiation Cures: These materials usually involve free-radical polymerization of mixtures of monomeric and oligomeric acrylates and methacrylates. Free radicals to initiate the reaction are created by exposure of the coating to an electron beam or by a photoinitiation system incorporated into a coating to be cured by exposure to ultraviolet radiation.

7) Image-Receiving Substrate 25

Image receiver 25 can be coated or uncoated paper, or a coated or uncoated plastic sheet. Compatibility with transfer layer 12 or the toner employed therewith is the primary criterion governing usage.

Dyes used in sublimation inks typically do not color fibrous cellulosic material, such as ordinary paper constructions. In order to create the necessary dissolution of the sublimation dye substance within the matrix of image receiver 25, the charge structures should be compatible.

One class of dyes known in the art as "disperse dyes" can effectively color polyester resin systems, particularly those with appreciable polyethylene terphthalate content. Hence, plastic films fitting this description may serve as the material of image-receiving substrate 25, as may paper coated with such films.

Another class of sublimation dyes, known in the art as cationic or basic dyes, can be used with image-receiving substrates consisting of (or coated with) any number of well-known cationic-dyeable materials. Cationic dyes produce color when positively charged, but can be reduced to relatively colorless neutral forms that exhibit good sublimation-transfer properties. The neutral species recover their color upon encountering acidic functional groups, which regenerate the cationic form by hydrogen-ion transfer. Thus, cationic-dyeable materials typically consist of resins impregnated with carboxyl or sulfonic acid groups. The ionic structures of the activated dye forms induce significant heat stability, rendering this class of dyes highly advantageous for applications in which multiple color layers are to be transferred to the same image-receiving substrate. It is also possible to layer an otherwise unsuitable plastic film with a cationic-dyeable coating.

For thermal-transfer inks, adhesion and heat-resistance characteristics are of primary importance. We have obtained good results with a variety of thermal-transfer dyes using MYLAR film, sold by E.I. duPont de Nemours Company, and MELINEX film, sold by ICI.

Paper offers firmness and heat resistance, and can be used with a variety of thermal-transfer inks.

EXAMPLE 1

With image receiver 25 consisting of paper, a vinyl acetate copolymer binder containing the desired pigment can be applied to a substrate layer 14 consisting of a polyester film.

EXAMPLE 2

With image receiver 25 consisting of paper, a vinyl butyral binder containing the desired pigment can be applied to a substrate layer 14 consisting of polypropylene, polyethylene, or copolymers thereof. Other suitable materials are enumerated in U.S. Pat. No. 4,833,124.

The terms and expressions which have been employed are used as terms of description and not of limitation, and there is no intention, in the use of such terms and expressions, of excluding any equivalents of the features shown and described or portions thereof, but it is recognized that various modifications are possible within the scope of the invention claimed.

What is claimed is:

1. A composite material for imaging by spark-discharge recording apparatus to produce a proofing transfer sheet, said substrate comprising:
   a. a support substrate;
   b. a layer of color transfer material disposed on the support substrate; and
   c. a conductive layer, substantially impervious to penetration by the color transfer material, disposed on the transfer layer.

2. The composite of claim 1 further comprising a protective coating layer disposed on the conductive layer.

3. The composite of claim 1 further comprising an undercoating layer substantially impervious to the color transfer material and disposed between said material and the substrate.

4. The composite of claim 1 wherein the substrate comprises paper.

5. The composite of claim 1 wherein the substrate is plastic film.

6. The composite of claim 5 wherein the plastic film is optical grade polyester film.

7. The composite of claim 5 wherein the plastic film is polystyrene.

8. The composite of claim 5 wherein the plastic film is cellulose acetate.

9. The composite of claim 1 wherein the substrate is at least 0.002 inch thick.

10. The composite of claim 1 wherein the conductive layer consists of material chosen from the group consisting of aluminum, copper and zinc.

11. The composite of claim 10 wherein the conductive layer has a thickness between approximately 350 and approximately 700 angstroms.

12. The composite of claim 1 wherein the transfer layer is a thermal-transfer ink.

13. The composite of claim 1 wherein the transfer layer is a sublimation ink.

14. The composite of claim 2 wherein the coating layer includes at least one crystalline metal oxide compound dispersed therein.

15. The composite of claim 14 wherein the crystalline metal oxide compound is selected from the group consisting of $Fe_3O_4$, gamma $Fe_2O_3$, $Co_3O_4$, $Mn_3O_4$, $CrO_2$, $ZnO$, $MnO_2$, $MoO_2$, $NbO_2$, $SnO_2$, $CuO$, $Cu_2O$, $TiO$, $Ti_2O_3$, $V_2O_3$, $VO_2$, $WO_2$ and $WO_3$.

16. The composite of claim 2 wherein the coating layer is a thermoset material.

17. The composite of claim 2 wherein the coating layer is an isocyanate-based material.

18. The composite of claim 2 wherein the coating layer is an aziridine material.

19. The composite of claim 2 wherein the coating layer is an epoxy material.

20. The composite of claim 2 wherein the coating layer is a radiation-cure material.

21. A composite material for imaging by spark-discharge recording apparatus to produce a proofing transfer sheet, said substrate comprising:
   a. a support substrate;
   b. a layer for accepting toner and transferring the toner to a receiving material, which layer is disposed on the support substrate; and
   c. a conductive layer disposed on the accepting and transferring layer.

22. The composite of claim 21 further comprising a protective coating layer disposed on the conductive layer.

23. The composite of claim 21 further comprising an undercoating layer substantially impervious to the color transfer material and disposed between said material and the substrate.

24. The composite of claim 21 wherein the substrate comprises paper.

25. The composite of claim 21 wherein the substrate is plastic film.

26. The composite of claim 25 wherein the plastic film is optical grade polyester film.

27. The composite of claim 25 wherein the plastic film is polystyrene.

28. The composite of claim 25 wherein the plastic film is cellulose acetate.

29. The composite of claim 25 wherein the substrate is at least 0.002 inch thick.

30. The composite of claim 21 wherein the conductive layer consists of material chosen from the group consisting of aluminum, copper and zinc.

31. The composite of claim 30 wherein the conductive layer has a thickness between approximately 350 and approximately 700 angstroms.

32. The composite of claim 22 wherein the coating layer is a thermoset material.

33. The composite of claim 22 wherein the coating layer is an isocyanate-based material.

34. The composite of claim 22 wherein the coating layer is an aziridine material.

35. The composite of claim 22 wherein the coating layer is an epoxy material.

36. The composite of claim 22 wherein the coating layer is a radiation-cure material.

37. A method of producing a proofing transfer sheet comprising the steps of:
   a. providing a construction comprising:
      1) a conductive layer,
      2) a layer of color transfer material disposed behind the conductive layer, and
      3) support substrate disposed behind the transfer layer;
   b. causing relative movement between the construction and a spark-discharge recording apparatus located proximately thereto; and
   c. removing the conductive layer at selected points by spark discharge to reveal underlying portions of the transfer layer.

38. A method of producing a proofing transfer sheet comprising the steps of:
   a. providing a construction comprising:
      1) a conductive layer,
      2) a layer for accepting toner and transferring the toner to a receiving material, which layer is disposed behind the conductive layer, and
      3) support substrate disposed behind the accepting and transferring layer;
   b. causing relative movement between the construction and a spark-discharge recording apparatus located proximately thereto; and
   c. removing the conductive layer at selected points by spark discharge to reveal underlying portions of the accepting and transferring layer.

39. A method of preparing color proofs from blank receiver material, the method comprising the steps of:
   a. forming a proofing transfer sheet according to steps comprising:
      1) positioning a substrate comprising a colorant adjacent a spark-discharge recording apparatus;
      2) causing relative movement between said construction and said apparatus; and
      3) selectively removing material with said apparatus at points on said substrate corresponding to points on the receiver material that are to receive color;
   b. applying the substrate to the blank receiver material under conditions promoting transfer of colorant from the substrate to the receiver material.

40. A method of preparing color proofs from blank receiver material, the method comprising the steps of:
   a. forming a proofing transfer sheet according to steps comprising:
      1) positioning a substrate comprising a surface capable of accepting a colorant adjacent a spark-discharge recording apparatus;
      2) causing relative movement between said construction and said apparatus; and
      3) selectively removing material with said apparatus at points on said substrate corresponding to points on the receiver material that are to receive color;
   b. applying a colorant to the substrate; and c. applying the substrate to the blank receive material under conditions promoting transfer of the colorant from the substrate to the receiver material.

41. The composite of claim 1 further comprising an undercoating layer that exhibits relatively weak adhesion to the color transfer material and disposed between said material and the substrate.

42. The composite of claim 21 further comprising an undercoating layer that exhibits relatively weak adhesion to the color transfer material and disposed between said material and the substrate.

* * * * *